(12) United States Patent
Gu et al.

(10) Patent No.: US 12,207,526 B2
(45) Date of Patent: Jan. 21, 2025

(54) DISPLAY SUBSTRATE, PREPARATION METHOD THEREFOR, AND DISPLAY APPARATUS

(71) Applicant: BOE Technology Group Co., Ltd., Beijing (CN)

(72) Inventors: Renquan Gu, Beijing (CN); Kang Guo, Beijing (CN); Feng Zhang, Beijing (CN); Meili Wang, Beijing (CN); Haitao Huang, Beijing (CN); Qi Yao, Beijing (CN); Xin Gu, Beijing (CN); Hua Huang, Beijing (CN); Guangcai Yuan, Beijing (CN); Xue Dong, Beijing (CN); Libo Wang, Beijing (CN); Detian Meng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 590 days.

(21) Appl. No.: 17/608,985

(22) PCT Filed: Jan. 25, 2021

(86) PCT No.: PCT/CN2021/073524
§ 371 (c)(1),
(2) Date: Nov. 4, 2021

(87) PCT Pub. No.: WO2022/155944
PCT Pub. Date: Jul. 28, 2022

(65) Prior Publication Data
US 2023/0255092 A1 Aug. 10, 2023

(51) Int. Cl.
*H10K 59/80* (2023.01)
*H10K 59/12* (2023.01)
(Continued)

(52) U.S. Cl.
CPC ....... *H10K 59/879* (2023.02); *H10K 59/1201* (2023.02); *H10K 59/122* (2023.02); *H04N 13/376* (2018.05); *H04N 13/398* (2018.05)

(58) Field of Classification Search
CPC ............. H10K 59/879; H10K 59/1201; H10K 59/122; H10K 59/8791; H04N 13/376; H04N 13/398
See application file for complete search history.

(56) References Cited

U.S. PATENT DOCUMENTS 5,855,994 A * 1/1999 Biebuyck ............. H10K 50/844
428/209
2012/0218173 A1 8/2012 Ohta et al.
(Continued)

FOREIGN PATENT DOCUMENTS

CN 102004274 A 4/2011
CN 102293052 A 12/2011
(Continued)

OTHER PUBLICATIONS

European Search Report for 21920339.5 Mailed Jun. 6, 2023.

*Primary Examiner* — Patricia D Valenzuela
(74) *Attorney, Agent, or Firm* — Ling Wu; Stephen Yang; Ling and Yang Intellectual Property

(57) ABSTRACT

Provided are a display substrate, a method for manufacturing a display substrate and a display apparatus. The display substrate includes a base, a drive structure layer disposed on the base, a light emitting element disposed on the drive structure layer, an encapsulation layer disposed on the light emitting element, a circular polarizer layer disposed on the encapsulation layer, and a lens definition layer and a lens structure layer disposed on the circular polarizer layer. The light emitting element includes a pixel definition layer provided with a plurality of sub-pixel openings; the lens structure layer includes a plurality of lenses disposed at (Continued)

intervals, the lens definition layer is disposed in a gap region between adjacent lenses, and an orthographic projection of each lens on the base contains an orthographic projection of a sub-pixel opening on the base.

19 Claims, 5 Drawing Sheets

(51) Int. Cl.
    *H10K 59/122*     (2023.01)
    *H04N 13/376*     (2018.01)
    *H04N 13/398*     (2018.01)

(56) References Cited

U.S. PATENT DOCUMENTS

| | | |
|---|---|---|
| 2014/0027725 A1 | 1/2014 | Lin et al. |
| 2016/0249046 A1* | 8/2016 | Yang .................... H04N 13/398 |
| 2020/0083484 A1 | 3/2020 | Lee et al. |
| 2020/0119113 A1 | 4/2020 | Lee et al. |
| 2021/0005583 A1 | 1/2021 | Iguchi et al. |
| 2021/0193763 A1 | 6/2021 | Sun et al. |
| 2021/0193949 A1 | 6/2021 | Huang et al. |
| 2022/0394236 A1 | 12/2022 | Gao |

FOREIGN PATENT DOCUMENTS

| | | | |
|---|---|---|---|
| CN | 107026239 A | | 8/2017 |
| CN | 110867528 A | | 3/2020 |
| CN | 110880560 A | | 3/2020 |
| CN | 111063706 A | | 4/2020 |
| CN | 111223904 A | | 6/2020 |
| CN | 111552093 A | | 8/2020 |
| CN | 111599850 A | | 8/2020 |
| CN | 111736242 A | | 10/2020 |
| CN | 111781775 A | | 10/2020 |
| CN | 112185268 A | | 1/2021 |
| JP | 2004317559 A | | 11/2004 |
| JP | 2013026021 | * | 2/2013 |
| JP | 2013026021 A | | 2/2013 |
| KR | 20130035538 A | | 4/2013 |
| KR | 101475827 B1 | | 12/2014 |

\* cited by examiner

DISPLAY SUBSTRATE, PREPARATION METHOD THEREFOR, AND DISPLAY APPARATUS

CROSS-REFERENCE TO RELATED APPLICATION

The present application is a U.S. National Phase Entry of International Application No. PCT/CN2021/073524 having an international filing date of Jan. 25, 2021, the content of which is hereby incorporated by reference.

TECHNICAL FIELD

The present disclosure relates to, but is not limited to, the field of display technology, in particular to a display substrate, a method for manufacturing a display substrate, and a display apparatus.

BACKGROUND

An Organic Light Emitting Diode (OLED) is an active light emitting display device, which has the advantages of self-luminescence, wide angle of view, high contrast, low power consumption, extremely high response speed and so on. With the continuous development of the display technology, display apparatuses with OLEDs as light emitting devices and signals controlled by Thin Film Transistors (TFTs) have become the mainstream products in the display field at present.

SUMMARY

The following is a brief description of the subject matter detailed herein. This brief description is not intended to limit the scope of protection of the claims.

An embodiment of the present disclosure provides a display substrate, including a base, a drive structure layer disposed on the base, a light emitting element disposed on the drive structure layer, an encapsulation layer disposed on the light emitting element, a circular polarizer layer disposed on the encapsulation layer, and a lens definition layer and a lens structure layer disposed on the circular polarizer layer, wherein the light emitting element includes a pixel definition layer provided with a plurality of sub-pixel openings; the lens structure layer includes a plurality of lenses disposed at intervals, the lens definition layer is disposed in a gap region between adjacent lenses, and an orthographic projection of each lens on the base contains an orthographic projection of at least one of the sub-pixel openings on the base.

An embodiment of the present disclosure further provides a display apparatus, including the display substrate.

An embodiment of the present disclosure further provides a method for manufacturing a display substrate, including:
  sequentially forming a drive structure layer, a light emitting element, an encapsulation layer and a circular polarizer layer on a base, the light emitting element including a pixel definition layer provided with a plurality of sub-pixel openings;
  forming a lens definition layer and a lens structure layer on the circular polarizer layer, the lens structure layer including a plurality of lenses disposed at intervals, the lens definition layer being disposed in a gap region between adjacent lenses, and an orthographic projection of each lens on the base containing an orthographic projection of at least one of the sub-pixel openings on the base.

After reading and understanding the drawings and the detailed description, other aspects can be understood.

BRIEF DESCRIPTION OF DRAWINGS

The drawings are used to provide a further understanding of the technical solutions of the present disclosure and constitute a part of the description, which are used together with the embodiments of the present disclosure to explain the technical solutions of the present disclosure and do not constitute limitations to the technical solutions of the present disclosure. The shape and size of the components in the drawings do not reflect the actual scale, and the purpose is only to describe the content of the present disclosure.

DETAILED DESCRIPTION

Figure 1:
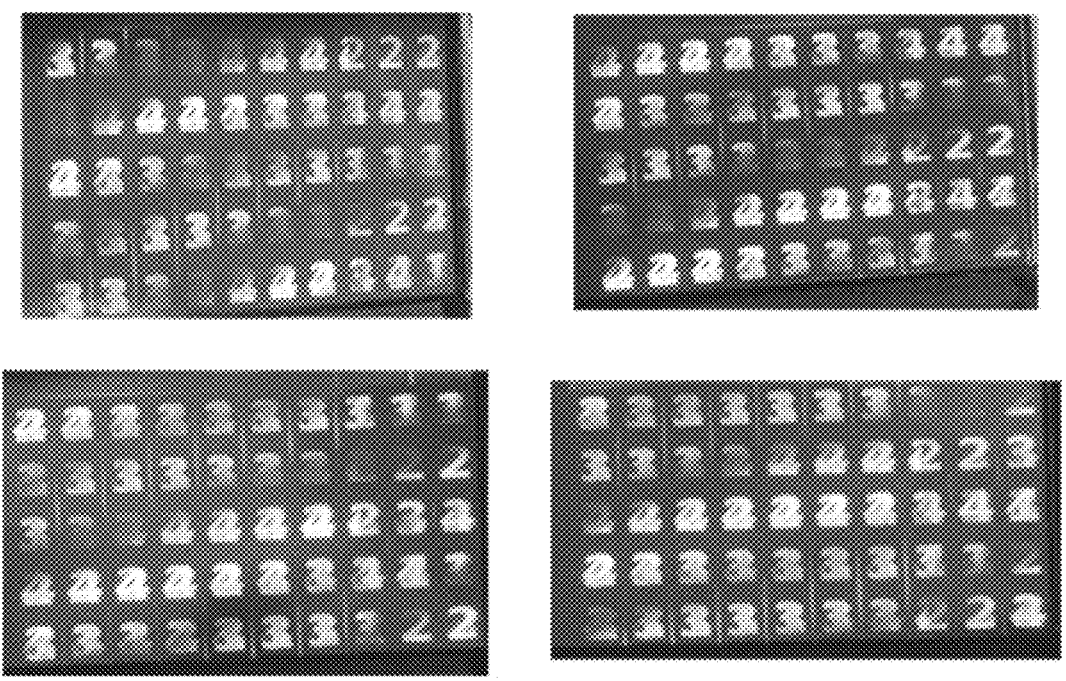
FIG. 1 illustrates a schematic diagram of a 3D display effect of a display substrate.

The embodiments of the present disclosure will be described below in detail with reference to the drawings. It should be noted that the embodiments may be implemented in a number of different forms. It is easy for those skilled in the art to understand the fact that the form and content may be changed into various forms without departing from the purpose and scope of the present disclosure. Therefore, the present disclosure should not be interpreted as being limited to the content recorded in the following embodiments. Without conflict, the embodiments in the present disclosure and the features in the embodiments may be freely combined with each other.

In the drawings, sometimes for clarity, the size of the constituent elements, the thickness of the layer or the area may be exaggerated. Therefore, any implementation of the present disclosure is not necessarily limited to the dimensions illustrated in the drawings, and the shape and size of the components in the drawings do not reflect the actual scale. In addition, the drawings schematically illustrate ideal examples, and any implementation of the present disclosure is not limited to the shape, numerical value or the like illustrated in the drawings.

"First", "second", "third" and other ordinal numerals in the specification are set to avoid the confusion of the constituent elements, rather than to limit the quantity.

For convenience, in the specification the terms such as "middle", "up", "down", "front", "back", "vertical", "horizontal", "top", "bottom", "inside" and "outside" indicating the orientation or position relationship are used to describe the position relationship between the constituent elements with reference to the drawings, only for the convenience of describing the specification and simplifying the description, instead of indicating or implying that the device or element referred to must have a specific orientation or be constructed and operated in a specific orientation, so they should not be understood as limitations to the present disclosure. The position relationship between the constituent elements may be appropriately varied according to the direction of the described constituent elements. Therefore, they are not limited to the words and sentences described herein, and may be appropriately replaced according to the actual situation.

Unless otherwise specified and limited, in the specification the terms "mount", "connected" and "connect" should be understood in a broad sense. For example, it may be fixed connection, detachable connection or integrated connection, may be mechanical connection or connection, or may be direct connection, indirect connection through intermediate components, or communication inside two components. For those skilled in the art, the specific meanings of the above terms in the present disclosure can be understood according to the actual situation.

In the specification, a transistor refers to a component which at least includes three terminals, i.e., a gate electrode, a drain electrode and a source electrode. The transistor has a channel region between the drain electrode (drain electrode terminal, drain region or drain electrode) and the source electrode (source electrode terminal, source region or source electrode), and the current can flow through the drain electrode, the channel region and the source electrode. It should be noted that the channel region herein refers to the region where the current mainly flows.

In the specification, a first electrode may be a drain electrode and a second electrode may be a source electrode, or a first electrode may be a source electrode and a second electrode may be a drain electrode. The functions of "source electrode" and "drain electrode" may sometimes be exchanged when transistors of opposite polarity are used or when the current direction changes during circuit operation. Therefore, "source electrode" and "drain electrode" may be exchanged with each other in the specification.

In the specification, "connection" includes the case where constituent elements are connected together by a component having a certain electrical action. As long as electrical signals between the connected constituent elements can be received and sent by "the component having a certain electrical action", there is no special limitation thereto. "Component having a certain electrical action", for example, may be an electrode or wiring, or a switching element (such as a transistor), a resistor, an inductor, a capacitor or any other functional element.

In the specification, "parallel" refers to a state in which an angle formed by two straight lines is more than $-10°$ and less than $10°$. Thereby, it also includes a state in which an angle is more than $-5°$ and less than $5°$. In addition, "vertical" refers to a state in which an angle formed by two straight lines is more than $80°$ and less than $100°$. Thereby it also includes a state in which an angle is more than $85°$ and less than $95°$.

In the present disclosure, "about" refers to a numerical value within a range of allowable process and measurement errors without strictly limiting the limit.

Lens is a kind of familiar optical element. Identical lenses are arranged in a plane according to a certain cycle to form a lens array. The optical property of a lens array consisting of ordinary lenses is the synthesis of single lens function. By integrating a lens array into an OLED device, the multi-view 3D/2D compatible high-resolution and multi-scenario display of an OLED screen can be realized. Nano imprint lithography process may be adopted to fabricate the lens array of the OLED device. When nano imprint lithography is adopted to fabricate a large-size substrate lens array, the imprint lithography is performed on the whole surface of the large-size substrate, and the shrinkage of the imprint lithography material is large (the specific shrinkage is related to the substrate, about more than 0.1%), which leads to a very large process deviation between the large-size substrate lens array and the underlying device.

For example, a display panel has 1920 sub-pixels, an aperture of the lens array is about 166 µm, and the sub-pixels correspond to the lenses in a one-to-one relationship. When the nano imprint lithography process is adopted to perform whole-surface imprint lithography, the shrinkage deviation of a single lens is about 0.058 µm. Therefore, the process deviation of the whole lens array is about 0.058 µm*1920=111.36 µm. However, the design tolerance deviation is about-4.4-3.6 µm. As a result, an alignment angle deviation of the whole lens array is about $0.17°$, while the design requirement is only $0.008°$. Therefore, due to the shrinkage of the imprint lithography material, there is a large deviation between the whole lens array and the sub-pixels of the display panel. For its 3D display effect, refer to FIG. 1. As shown in FIG. 1, the sub-pixel brightness of the display substrate is uneven, the display of each sub-pixel has crosstalk with each other, and the 3D display effect is poor.

Figure 2:
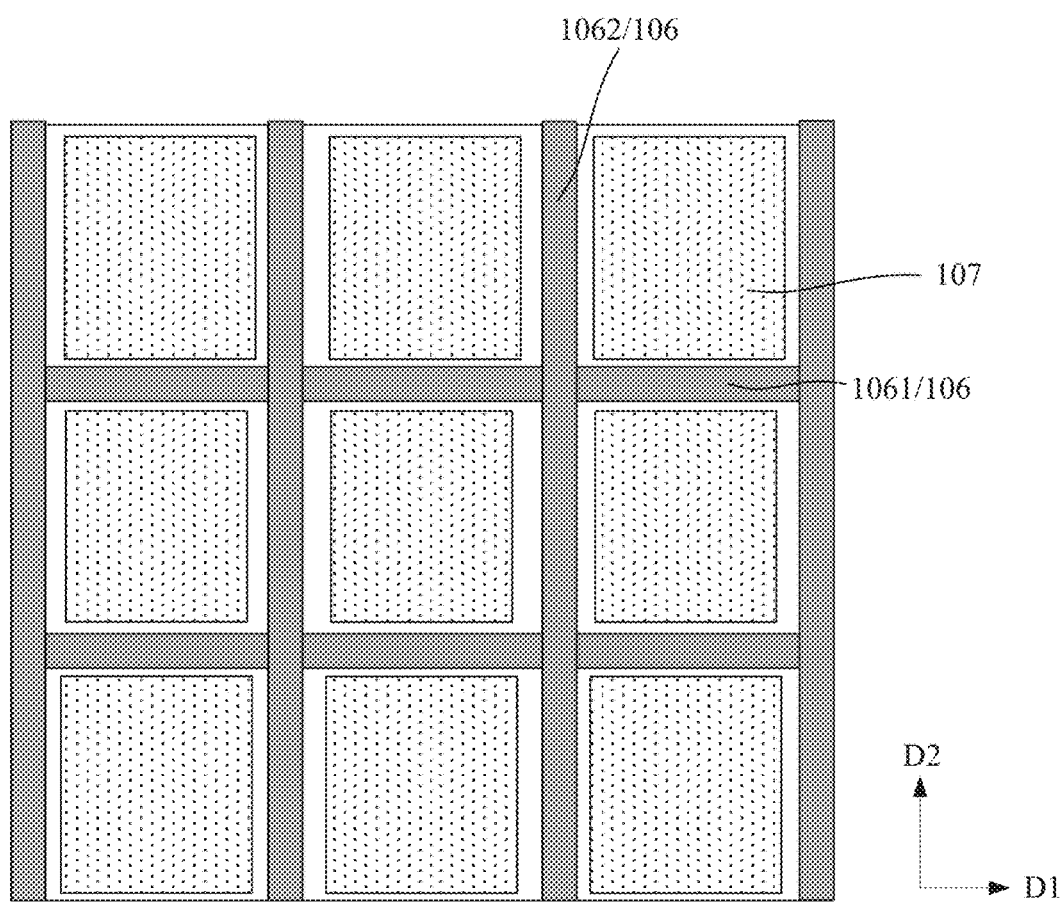
FIG. 2 illustrates a schematic diagram of a planar structure of a display substrate according to an embodiment of the present disclosure.
Figure 3:
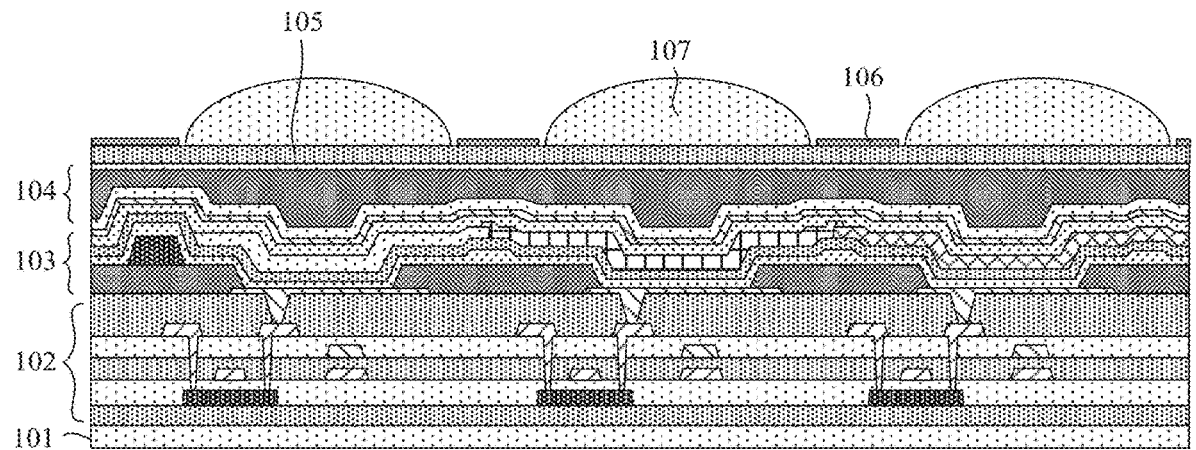
FIG. 3 illustrates a schematic diagram of a sectional structure of a display substrate according to an embodiment of the present disclosure.

FIG. 2 illustrates a schematic diagram of a planar structure of a display substrate according to an embodiment of the present disclosure. FIG. 3 illustrates a schematic diagram of a sectional structure of a display substrate according to an embodiment of the present disclosure. As shown in FIG. 2 and FIG. 3, the display substrate includes a base 101, a drive structure layer 102 disposed on the base 101, a light emitting element 103 disposed on the drive structure layer 102, an encapsulation layer 104 disposed on the light emitting element 103, a circular polarizer layer 105 disposed on the encapsulation layer 104, and a lens definition layer 106 and a lens structure layer 107 disposed on the circular polarizer layer 105. In some possible embodiments, the display substrate may include other film layers, such as post spacers, which is not limited in the present disclosure.

The light emitting element 103 includes a pixel definition layer provided with a plurality of sub-pixel openings.

The lens structure layer 107 includes a plurality of lenses disposed at intervals, the lens definition layer 106 is disposed in a gap region between adjacent lenses, and an orthographic projection of each lens on the base 101 contains an orthographic projection of at least one of the sub-pixel openings on the base 101.

In the embodiment of the present disclosure, by disposing the lens definition layer 106, a plurality of lenses in the lens structure layer 107 are spaced apart by the lens definition layer 106, and are independent of each other. When the imprint lithography material forming the lenses shrinks, the entire lens structure will not shrink in large size due to the isolation effect of the lens definition layer 106 between adjacent lenses, and the shrinkage of the imprint lithography material forming each lens can be ignored, thus realizing the accurate alignment of the large-size nano imprint lithography lenses and the light emitting element 103, and improving the 3D display effect. The angle deviation of the display substrate provided by the embodiment of the present disclosure is within the design requirement) (0.008°), which is far less than 0.17°.

In an exemplary embodiment, as shown in FIG. 2, the lens definition layer 106 includes a plurality of first definition lines 1061 extending along a first direction D1 and a plurality of second definition lines 1062 extending along a second direction D2, the plurality of first definition lines 1061 and the plurality of second definition lines 1062 intersect to define a plurality of grid regions, and the plurality of lenses are disposed in the plurality of grid regions in a one-to-one correspondence relationship.

In an exemplary embodiment, the pixel definition layer further includes a plurality of retaining walls disposed around the sub-pixel openings, and an orthographic projection of the retaining walls on the base 101 contains an orthographic projection of the lens definition layer 106 on the base 101.

In an exemplary embodiment, the material of the lens definition layer 106 is a hydrophobic material.

In an exemplary embodiment, the hydrophobic material includes any one or more of Teflon, polyamide, polyolefin, siloxane, and so on.

In an exemplary embodiment, the base 101 may be a flexible base or may be a rigid base. The drive structure layer 102 of each sub-pixel may include a plurality of transistors and a storage capacitor which form a pixel drive circuit. Illustration is made in FIG. 3 by taking each sub-pixel including a drive transistor and a storage capacitor as an example. The light emitting element 103 may include an anode, a pixel definition layer, an organic light emitting layer and a cathode. The anode is connected with a drain electrode of the drive transistor through a via, the organic light emitting layer is connected with the anode, the cathode is connected with the organic light emitting layer, and the organic light emitting layer emits light of corresponding color under the drive of the anode and the cathode. The encapsulation layer 104 may include a first encapsulation layer, a second encapsulation layer and a third encapsulation layer stacked, the first encapsulation layer and the third encapsulation layer may be made of an inorganic material, the second encapsulation layer may be made of an organic material, and the second encapsulation layer is disposed between the first encapsulation layer and the third encapsulation layer to ensure that the external water vapor cannot enter the light emitting element 103.

In an exemplary embodiment, the organic light emitting layer may include a hole injection layer (HIL), a hole transport layer (HTL), an electron block layer (EBL), a light emitting layer (EML), a hole block layer (HBL), an electron transport layer (ETL) and an electron injection layer (EIL). In an exemplary embodiment, the hole injection layers and the electron injection layers of all sub-pixels may be connected together to form a common layer, the hole transport layers and the electron transport layers of all sub-pixels may be connected together to form a common layer, the hole block layers of all sub-pixels may be connected together to form a common layer, and the light emitting layers and the electron block layers of adjacent sub-pixels may overlap a little, or may be isolated.

Figure 4:
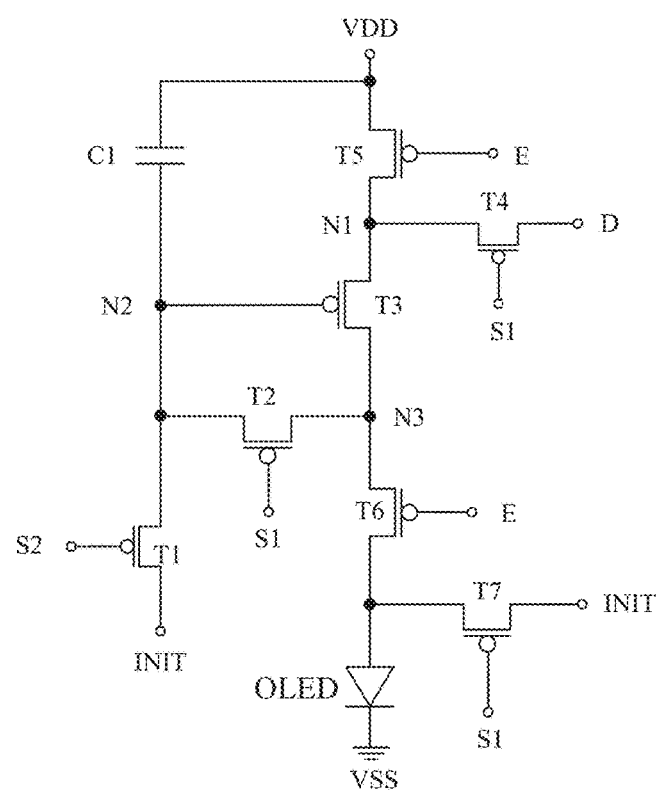
FIG. 4 illustrates a schematic diagram of a structure of a pixel drive circuit of a display substrate according to an embodiment of the present disclosure.

In an exemplary embodiment, the pixel drive circuit may be a 3T1C, 4T1C, 5T1C, 5T2C, 6T1C or 7T1C structure. FIG. 4 illustrates a schematic diagram of an equivalent circuit of a pixel drive circuit. As shown in FIG. 4, the pixel drive circuit may include seven switch transistors (first transistor T1 to seventh transistor T7), one storage capacitor C and seven signal lines (data signal line D, first scan signal line S1, second scan signal line S2, light emitting signal line E, initial signal line INIT, first power supply line VDD and second power supply line VSS).

In an exemplary embodiment, a first end of the storage capacitor C is connected with the first power supply line VDD, and a second end of the storage capacitor C is connected with a second node N2, that is, the second end of the storage capacitor C is connected with a control electrode of the third transistor T3.

A control electrode of the first transistor T1 is connected with the second scan signal line S2, a first electrode of the first transistor T1 is connected with the initial signal line INIT, and a second electrode of the first transistor is connected with a second node N2. When an ON level scan signal is applied to the second scan signal line S2, the first transistor T1 transmits initialization voltage to the control electrode of the third transistor T3 to initialize the charge amount of the control electrode of the third transistor T3.

A control electrode of the second transistor T2 is connected with the first scan signal line S1, a first electrode of the second transistor T2 is connected with the second node N2, and a second electrode of the second transistor T2 is connected with a third node N3. When the ON level scan signal is applied to the first scan signal line S1, the second transistor T2 enables the control electrode of the third transistor T3 to be connected with the second electrode.

The control electrode of the third transistor T3 is connected with the second node N2, that is, the control electrode of the third transistor T3 is connected with the second end of the storage capacitor C, a first electrode of the third transistor T3 is connected with a first node N1, and a second electrode of the third transistor T3 is connected with the third node N3. The third transistor T3 may be called a drive transistor, and the third transistor T3 determines the amount of drive current flowing between the first power supply line VDD and the second power supply line VSS according to the potential difference between its control electrode and first electrode.

A control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4 may be called a switch transistor, a scan transistor, etc. when the ON level scan signal is applied to the first scan signal line S1, the fourth transistor T4 makes the data voltage of the data signal line D input to the pixel drive circuit.

A control electrode of the fifth transistor T5 is connected with the light emitting signal line E, a first electrode of the fifth transistor T5 is connected with the first power supply line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of the light emitting element 103. The fifth transistor T5 and the sixth transistor T6 may be called light emitting transistors. When the ON level light emitting signal is applied to the light emitting signal line E, the fifth transistor T5 and the sixth transistor T6 make the light emitting element 103 to emit light by forming a drive current path between the first power supply line VDD and the second power supply line VSS.

A control electrode of the seventh transistor T7 is connected with the first scan signal line S1, a first electrode of the seventh transistor T7 is connected with the initial signal line INIT, and a second electrode of the seventh transistor T7 is connected with the first electrode of the light emitting element 103. When the ON level scan signal is applied to the first scan signal line S1, the seventh transistor T7 transmits initialization voltage to the first electrode of the light emitting element 103 to initialize or release the amount of charge accumulated in the first electrode of the light emitting element 103.

In an exemplary embodiment, a second electrode of the light emitting element 103 is connected with the second power supply line VSS, a signal of the second power supply line VSS is a low-level signal, and a signal of the first power supply line VDD is a continuously provided high-level signal. The first scan signal line S1 is a scan signal line in a pixel drive circuit of a current display row, and the second scan signal line S2 is a scan signal line in a pixel drive circuit of a previous display row, that is, for an nth display row, the first scan signal line S1 is S (n), the second scan signal line S2 is S (n-1), and the second scan signal line S2 of the current display row and the first scan signal line S1 of the pixel drive circuit of the previous display row are the same signal line, thus reducing the signal lines of the display panel and realizing the narrow frame of the display panel.

In an exemplary embodiment, the first transistors T1 to the seventh transistors T7 may be P-type transistors or may be N-type transistors. Using the same type of transistors in the pixel drive circuit can simplify the process flow, reduce the process difficulty of the display panel, and improve the yield of the product. In some possible embodiments, the first transistor T1 to the seventh transistor T7 may include P-type transistors and N-type transistors.

In an exemplary embodiment, the first scan signal line S1, the second scan signal line S2, the light emitting signal line E and the initial signal line INIT extend along the first direction D1, and the second power supply line VSS, the first power supply line VDD and the data signal line D extend along the second direction D2.

In an exemplary embodiment, the light emitting element 103 may be an Organic Light Emitting Diode (OLED), including a first electrode (anode), an organic light emitting layer, and a second electrode (cathode) stacked.

Figure 5:
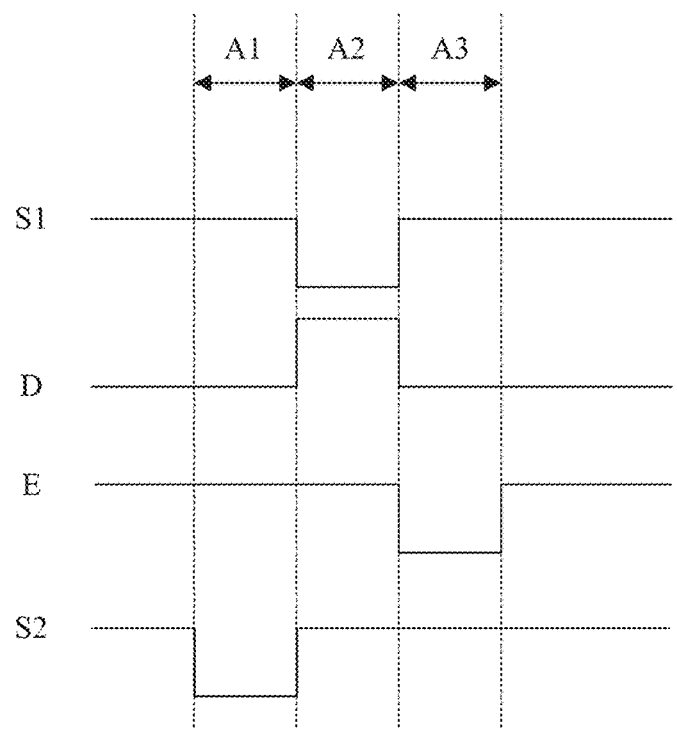
FIG. 5 illustrates a working timing sequence diagram of a pixel drive circuit of a display substrate according to an embodiment of the present disclosure.

FIG. 5 illustrates a working timing sequence diagram of a pixel drive circuit. The exemplary embodiment of the present disclosure will be described below through the working process of the pixel drive circuit illustrated in FIG. 4. The pixel drive circuit in FIG. 4 includes seven transistors (first transistor T1 to seventh transistor T7), one storage capacitor C and seven signal lines (data signal line D, first scan signal line S1, second scan signal line S2, light emitting signal line E, initial signal line INIT, first power supply line VDD and second power supply line VSS). The seven transistors are all P-type transistors.

In an exemplary embodiment, the working process of the pixel drive circuit may include the following stages.

In a first stage A1, which is called a reset stage, a signal of the second scan signal line S2 is a low-level signal, and signals of the first scan signal line S1 and the light emitting signal line E are high-level signals. The signal of the second scan signal line S2 is a low-level signal, so that the first transistor T1 is ON, and a signal of the initial signal line INIT is provided to the second node N2 to initialize the storage capacitor C to clear the original data voltage in the storage capacitor. The signals of the first scan signal line S1 and the light emitting signal line E are high-level signals, so that the second transistor T2, the fourth transistor T4, the fifth transistor T5, the sixth transistor T6 and the seventh transistor T7 are OFF. The OLED does not emit light in this stage.

In a second stage A2, which is called a data write stage or threshold compensation stage, the signal of the first scan signal line S1 is a low-level signal, the signals of the second scan signal line S2 and the light emitting signal line E are high-level signals, and the data signal line D outputs data voltage. In this stage, since the second end of the storage capacitor C is at a low level, the third transistor T3 is ON. The signal of the first scan signal line S1 is a low-level signal, so that the second transistor T2, the fourth transistor T4 and the seventh transistor T7 are ON. The second transistor T2 and the fourth transistor T4 are ON, so that the data voltage output by the data signal line D is provided to the second node N2 through the first node N1, the ON third transistor T3, the third node N3 and the ON second transistor T2, a difference between the data voltage output by the data signal line D and the threshold voltage of the third transistor T3 is charged into the storage capacitor C, the voltage of the second end (the second node N2) of the storage capacitor C is Vd-|Vth|, Vd is the data voltage output by the data signal line D, and Vth is the threshold voltage of the third transistor T3. The seventh transistor T7 is ON, so that the initial voltage of the initial signal line INIT is provided to the first electrode of the OLED to initialize (resets) the first electrode of the OLED to clear its internal pre-stored voltage to complete the initialization, thus ensuring that the OLED does not emit light. The signal of the second scan signal line S2 is a high-level signal, so that the first transistor T1 is OFF. The signal of the light emitting signal line E is a high-level signal, so that the fifth transistor T5 and the sixth transistor T6 are OFF.

In a third stage A3, which is called a light emitting stage, the signal of the light emitting signal line E is a low-level signal, and the signals of the first scan signal line S1 and the second scan signal line S2 are high-level signals. The signal of the light emitting signal line E is a low-level signal, so that the fifth transistor T5 and the sixth transistor T6 are ON, and the power supply voltage output by the first power supply line VDD is provided as drive voltage to the first electrode of the OLED through the ON fifth transistor T5, third transistor T3 and sixth transistor T6 to drive the OLED to emit light.

In the drive process of the pixel drive circuit, the drive current flowing through the third transistor T3 (drive transistor) is determined by the voltage difference between its gate electrode and first electrode. Since the voltage of the second node N2 is Vdata-|Vth|, the drive current of the third transistor T3 is:

$$I=K*(Vgs\text{-}Vth)^2=K*[(Vdd\text{-}Vd+|Vth|)\text{-}Vth]2=K*[(Vdd\text{-}Vd)]^2$$

Where, I is the drive current flowing through the third transistor T3, that is, the drive current driving the OLED, K is a constant, VGS is the voltage difference between the gate electrode and the first electrode of the third transistor T3, Vth is the threshold voltage of the third transistor T3, Vd is the data voltage output by the data signal line D, and Vdd is the power supply voltage output by the first power supply line VDD.

The process of manufacturing the display substrate will be exemplarily described below. "Patterning process" mentioned in the present disclosure includes photoresist coating, mask exposure, development, etching, photoresist stripping and so on for metal materials, inorganic materials or transparent conducting materials, and includes organic material coating, mask exposure, development and so on for organic materials; deposition may be implemented by adopting any one or more of sputtering, evaporation and chemical vapor deposition; coating may be implemented by adopting any one or more of spray coating, spin coating and inkjet printing; and etching may be implemented by adopting any one or more of dry etching and wet etching, which are not limited in the present disclosure. "Thin film" refers to a layer of thin film formed by a certain material on a base through deposition, coating or other processes. If a "thin film" does not need a patterning process in the whole manufacturing process, the "thin film" may also be called a "layer". If a "thin film" needs a patterning process in the whole manufacturing process, it is called "thin film" before the patterning process and "layer" after the patterning process. A "layer" obtained after a patterning process includes at least one "pattern". "A and B are disposed in the same layer" in the present disclosure means that A and B are formed at the same time through the same patterning process, and the "thickness" of the film layer is the size of the film layer in a direction perpendicular to the display substrate. In an exemplary embodiment of the present disclosure, "an orthographic projection of A contains an orthographic projection of B" means that the boundary of the orthographic projection of B falls within the boundary range of the orthographic projection of A, or the boundary of the orthographic projection of A coincides with the boundary of the orthographic projection of B.

(1) A base 101 is manufactured on a glass carrier plate. In an exemplary embodiment, the base 101 may include a first flexible material layer, a first inorganic material layer, a semiconductor layer, a second flexible material layer and a second inorganic material layer stacked on the glass carrier plate. The material of the first and second flexible material layers may be polyimide (PI), polyethylene terephthalate (PET) or polymer soft film subjected to surface treatment. The material of the first and second inorganic material layers may be silicon nitride (SiNx) or silicon oxide (SiOx) used for improving the water oxygen resistance of the base. The first and second inorganic material layers are also called barrier layers. The material of the semiconductor layer may be amorphous silicon (a-si). In an exemplary embodiment, taking a stacked structure PI1/Barrier1/a-si/PI2/Barrier2 as an example, the manufacturing process may include: firstly coating a layer of polyimide on a glass carrier plate, and curing it to form a first flexible (PI1) layer; then depositing a barrier thin film on the first flexible layer to form a first barrier (Barrier1) layer covering the first flexible layer; then depositing a layer of amorphous silicon thin film on the first barrier layer to form an amorphous silicon (a-si) layer covering the first barrier layer; then coating a layer of polyimide on the amorphous silicon layer, and curing it to form a second flexible (PI2) layer; then depositing a barrier thin film on the second flexible layer to form a second barrier (Barrier2) layer covering the second flexible layer, till which the manufacturing of the base 101 is completed.

In an exemplary embodiment, the base 101 may also be a rigid base.

(2) A drive structure layer 102 pattern is formed on the base 101. In an exemplary embodiment, the process of forming the drive structure layer 102 may include the following operations.

A first insulating thin film and an active layer thin film are sequentially deposited on the base 101, the active layer thin film is patterned through a patterning process to form a first insulating layer covering the entire base 101 and an active layer pattern disposed on the first insulating layer, and the active layer pattern includes a first active layer.

Then a second insulating thin film and a first metal thin film are sequentially deposited, the first metal thin film is patterned through a patterning process to form a second insulating layer covering the active layer pattern and a first gate metal layer pattern disposed on the second insulating layer, and the first gate metal layer pattern includes a first gate electrode, a first capacitor electrode and a plurality of gate lines (not shown).

After that, a third insulating thin film and a second metal thin film are sequentially deposited, the second metal thin film is patterned through a patterning process to form a third insulating layer covering the first gate metal layer and a second gate metal layer pattern disposed on the third insulating layer, the second gate metal layer pattern includes a second capacitor electrode, and the position of the second capacitor electrode corresponds to the position of the first capacitor electrode.

Next, a fourth insulating thin film is deposited, the fourth insulating thin film is patterned through a patterning process to form a fourth insulating layer pattern covering the second gate metal layer, the fourth insulating layer is provided with a plurality of first vias, the positions of the plurality of first vias respectively correspond to the positions of the two ends of the first active layer, and the fourth insulating layer, the third insulating layer and the second insulating layer in the plurality of first vias are etched to respectively expose the surface of the first active layer.

Then, a third metal thin film is deposited, the third metal thin film is patterned through a patterning process to form a source and drain metal layer pattern on the fourth insulating layer, the source and drain metal layer pattern includes patterns of a first source electrode, a first drain electrode and a plurality of data lines (not shown), and the first source electrode and the first drain electrode are respectively connected with the first active layer 12A through the first vias. In an exemplary embodiment, the source and drain metal layer may further include any one or more of a power supply line (VDD), a compensation line, and an auxiliary cathode according to actual needs. The source and drain metal layer is also called a first source and drain metal layer (SD1).

So far, the drive structure layer 102 pattern is formed on the base 101. The drive structure layer 102 includes a first insulating layer disposed on a base, an active layer disposed on the first insulating layer, a second insulating layer covering the active layer, a first gate metal layer disposed on the second insulating layer, a third insulating layer covering the first gate metal layer, a second gate metal layer disposed on the third insulating layer, a fourth insulating layer covering the second gate metal layer, and a source and drain metal layer disposed on the fourth insulating layer. The active layer at least includes a first active layer. The first gate metal layer at least includes a first gate electrode and a first capacitor electrode. The second gate metal layer at least includes a second capacitor electrode. The source and drain metal layer includes at least a first source electrode and a first drain electrode. The first active layer, the first gate electrode, the first source electrode and the first drain electrode form a first transistor. The first capacitor electrode and the second capacitor electrode form a first storage capacitor. In an exemplary embodiment, the first transistor may be a drive transistor in a pixel drive circuit, and the drive transistor may be a Thin Film Transistor (TFT).

In an exemplary embodiment, the first insulating layer, the second insulating layer, the third insulating layer and the fourth insulating layer may be made of any one or more of silicon oxide (SiOx), silicon nitride (SiNx) and silicon oxynitride (SiON), and may be a single layer, a multi-layer or a composite layer. The first insulating layer is called a buffer layer, which is used to improve the water oxygen resistance of the base. The second insulating layer and the third insulating layers are called gate insulating (GI) layers. The fourth insulating layer is called an interlayer insulating (ILD) layer. The first metal thin film, the second metal thin film and the third metal thin film may be made of a metal material, such as any one or more of silver (Ag), copper (Cu), aluminum (Al), titanium (Ti) and molybdenum (Mo), or an alloy material of the above metals, such as aluminum-neodymium alloy (AlNd) or molybdenum-niobium alloy (MoNb), which may be a single-layer structure or multi-layer composite structure, such as Ti/Al/Ti. The active layer thin film may be made of an amorphous indium gallium zinc oxide (a-IGZO), zinc oxynitride (ZnON), indium zinc tin oxide (IZTO), amorphous silicon (a-Si), polycrystalline silicon (p-Si), hexathiophene, polythiophene and other materials, that is, the present disclosure is applicable to transistors manufactured based on oxide technology, silicon technology and organic matter technology.

(3) A light emitting element 103 pattern is formed on the base on which the above pattern is formed. In an exemplary embodiment, the process of manufacturing the light emitting element 103 may include the following operations.

A first planarization thin film is coated on the base on which the above pattern is formed, and the first planarization thin film is patterned through a patterning process to form a first planarization (PLN) layer pattern. A second via is formed in the first planarization layer, and the first planarization layer in the second via is etched to expose the surface of the first drain electrode.

A transparent conducting thin film is deposited on the base on which the above pattern is formed, and the transparent conducting thin film is patterned through a patterning process to form an anode pattern. The anode is formed on the first planarization layer and connected with the first drain electrode through the second via.

A pixel definition thin film is coated on the base on which the above pattern is formed, and a pixel definition layer (PDL) pattern is formed through mask, exposure and development processes. The pixel definition layer is provided with sub-pixel openings, and the pixel definition thin film in the sub-pixel openings is developed to expose the surface of the anode.

A post spacer layer pattern is formed on the base on which the above pattern is formed, the post spacer layer includes a plurality of supporting posts, and the supporting posts are disposed at intervals on the pixel definition layer.

An organic light emitting layer and a cathode are sequentially formed on the base on which the above pattern is formed. The organic light emitting layer is formed at least in the pixel openings to realize the connection between the organic light emitting layer and the anode. Since the anode is connected with the first drain electrode of the first transistor, the connection between the organic light emitting layer and the first drain electrode of the first transistor is realized. The cathode is formed on the organic light emitting layer and connected with the organic light emitting layer. In an exemplary embodiment, the organic light emitting layer may include a hole injection layer, a hole transport layer, a light emitting layer, an electron transport layer and an electron injection layer stacked, and the cathode may be made of any one or more of magnesium (Mg), silver (Ag), aluminum (Al), copper (Cu) and lithium (Li), or an alloy of any one or more of the above metals.

So far, the light emitting element 103 pattern is formed on the drive structure layer 102. The light emitting element may include an anode, a pixel definition layer (PDL), post spacers (PS), an organic light emitting layer, a cathode, and so on. The anode is disposed on the first planarization layer, and is connected with the first drain electrode of the drive transistor through the via in the first planarization layer; the pixel definition layer is disposed on the anode and the planarization layer, the pixel definition layer is provided with sub-pixel openings, and the sub-pixel opening exposes the anode; at least part of the organic light emitting layer is disposed in the sub-pixel opening, and the organic light emitting layer is connected with the anode; the cathode is disposed on the organic light emitting layer, and the cathode is connected with the organic light emitting layer; the organic light emitting layer emits light of corresponding color under the drive of the anode and the cathode.

(4) An encapsulation layer 104 pattern is formed on the base on which the above pattern is formed. In an exemplary embodiment, the encapsulation layer 104 may include a first encapsulation layer, a second encapsulation layer and a third encapsulation layer stacked. The first encapsulation layer and the third encapsulation layer are made of an inorganic material, and the second encapsulation layer is made of an organic material.

(5) A circular polarizer (CPOL) layer 105 pattern is formed on the base on which the above pattern is formed.

In an exemplary embodiment, the circular polarizer layer 105 may include an adhesive layer disposed on the encapsulation layer, a barrier layer disposed on the adhesive layer, a phase difference layer disposed on the barrier layer, and a polarizer layer disposed on the phase difference layer.

(6) Patterns of a lens definition layer 106 and a lens structure layer 107 are formed on the base on which the above pattern is formed, as shown in FIG. 3. The lens structure layer 107 includes a plurality of lenses disposed at intervals, the lens definition layer 106 is disposed in a gap region between adjacent lenses, and an orthographic projection of each lens on the base 101 contains an orthographic projection of at least one sub-pixel opening on the base 101.

Figure 6A:
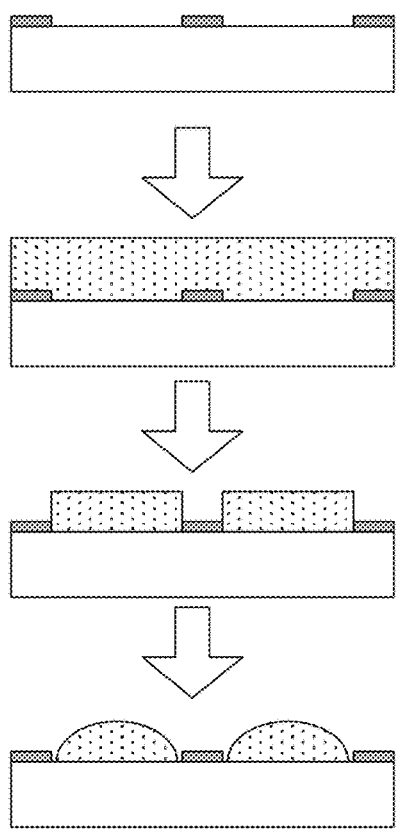
FIG. 6a and FIG. 6b illustrate schematic diagrams of processes of forming a lens definition layer and a lens structure layer according to an embodiment of the present disclosure.
Figure 6B:
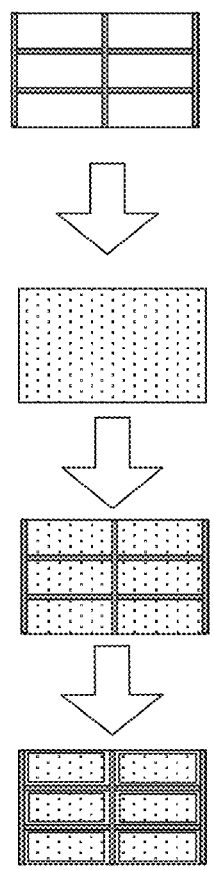

In an exemplary embodiment, as shown in FIG. 6a and FIG. 6b, the process of forming the lens definition layer 106 and the lens structure layer 107 may include the following operations:

A layer of hydrophobic material is coated on the circular polarizer layer 105, and the hydrophobic material is patterned through photo mask exposure and development to form a lens definition layer 106 pattern. The lens definition layer 106 includes a plurality of first definition lines 1061 extending along a first direction D1 and a plurality of second definition lines 1062 extending along a second direction D2, the plurality of first definition lines 1061 and the plurality of second definition lines 1062 intersect to define a plurality of grid regions, each grid region corresponds to one or more sub-pixels formed previously, and the grid regions correspond to subsequently formed lenses in a one-to-one relationship.

An imprint lithography material is coated on the lens definition layer 106, and the film thickness of the imprint lithography material is uniformly distributed.

The imprint lithography material is patterned through photo mask exposure and development to form a grid-like imprint lithography material. In this act, the imprint lithography material in regions with the hydrophobic material on the lens definition layer 106 is removed, and the imprint lithography material in regions without the hydrophobic material is remained, thus forming a grid-like imprint lithography material. Each imprint lithography material grid is formed in a grid region defined by the lens definition layer 106.

An imprint lithography process is performed on the grid-like imprint lithography material by adopting an imprint lithography template to form a plurality of grid-like lenses. The lens definition layer 106 makes adjacent lenses independent of each other. When the imprint lithography material shrinks, for each independent lens, the imprint lithography material shrinks about 0.058 μm, but for the 166 μm large-size lens structure, the shrinkage of the imprint lithography material of each lens does not affect the display effect of the overall lens structure.

In an exemplary embodiment, the hydrophobic material includes any one or more of Teflon, polyamide, polyolefin, siloxane, and so on.

Figure 7:
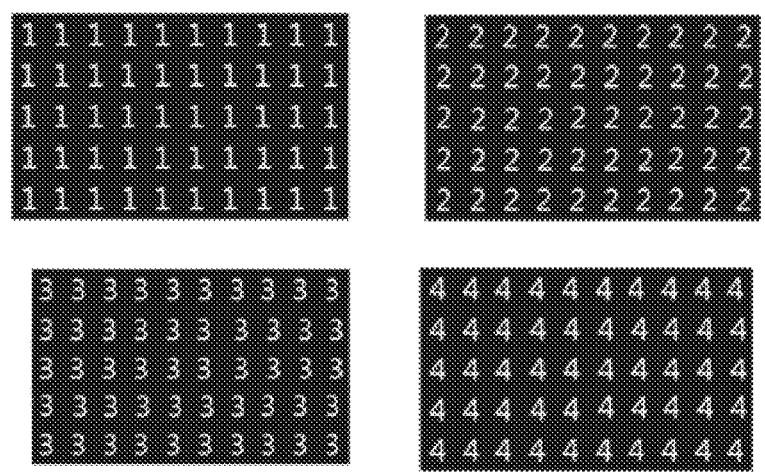
FIG. 7 illustrates a schematic diagram of a 3D display effect of a display substrate according to an embodiment of the present disclosure.

From the structure of the display substrate and the manufacturing process in the exemplary embodiment of the present disclosure, it can be seen that, in the exemplary embodiment of the present disclosure, by forming a lens definition layer pattern using a hydrophobic material, a plurality of lenses obtained through imprint lithography are gridded, and adjacent lenses are independent of each other; when the imprint lithography material shrinks, the entire lens structure will not shrink in large size due to the isolation of the lens definition layer, and the shrinkage of the imprint lithography material forming each lens can be ignored, thus realizing the accurate alignment of the large-size nano imprint lithography lenses and the light emitting element, and improving the 3D display effect. Exemplarily, the 3D display effect of the display substrate according to the embodiment of the present disclosure is as illustrated in FIG. 7.

The structure and manufacturing process of the display substrate in the exemplary embodiment of the present disclosure is only an exemplary description. In an exemplary embodiment, the corresponding structure may be changed and the patterning process may be increased or decreased according to the actual needs, which is not limited in the present disclosure.

Figure 8:
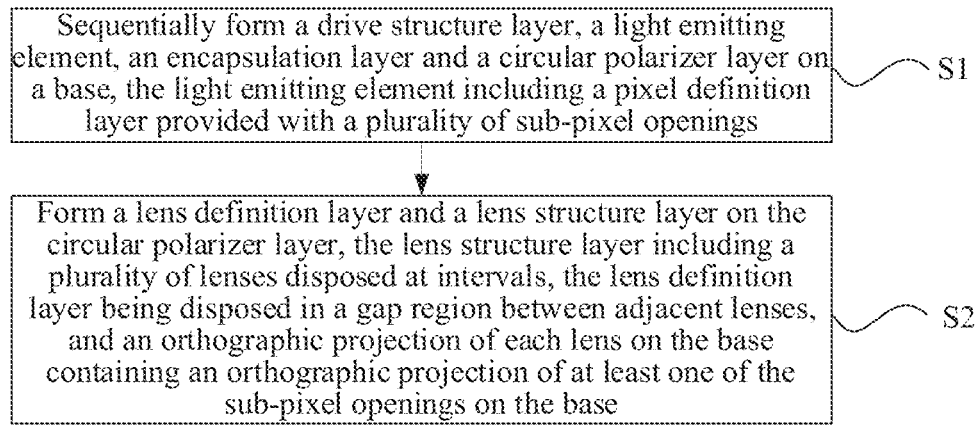
FIG. 8 illustrates a flowchart of a method for manufacturing a display substrate according to an embodiment of the present disclosure.

As shown in FIG. 8, the present disclosure further provides a method for manufacturing a display substrate, which includes the following acts:

In act S1, a drive structure layer, a light emitting element, an encapsulation layer and a circular polarizer layer are sequentially formed on a base, wherein the light emitting element includes a pixel definition layer provided with a plurality of sub-pixel openings.

In act S2, a lens definition layer and a lens structure layer are formed on the circular polarizer layer, wherein the lens structure layer includes a plurality of lenses disposed at intervals, the lens definition layer is disposed in a gap region between adjacent lenses, an orthographic projection of each lens on the base contains an orthographic projection of at least one of the sub-pixel openings on the base.

In an exemplary embodiment, forming the lens definition layer on the circular polarizer layer includes: coating a layer of a hydrophobic material on the circular polarizer layer; and patterning the hydrophobic material through a first patterning process to form the lens definition layer.

In an exemplary embodiment, forming the lens structure layer on the circular polarizer layer includes: coating a layer of an imprint lithography material with a uniform film thickness on the base on which the lens definition layer is formed; patterning the imprint lithography material through a second patterning process to form a grid-like imprint lithography material, wherein the grid-like imprint lithography material does not overlap with the lens definition layer; and performing imprint lithography on the grid-like imprint lithography material through an imprint lithography template to form a plurality of lenses disposed at intervals.

In an exemplary embodiment, the hydrophobic material includes any one or more of Teflon, polyamide, polyolefin, siloxane, and so on.

In an exemplary embodiment, the pixel definition layer further includes a plurality of retaining walls disposed around the sub-pixel openings, and an orthographic projection of the retaining walls on the base contains an orthographic projection of the lens definition layer on the base.

An exemplary embodiment of the present disclosure further provides a display apparatus, which includes the display substrate in the above embodiments. The display apparatus provided by the present disclosure may be any product or component with a display function such as mobile phone, tablet computer, TV, display, notebook computer, digital photo frame or navigator. In an exemplary embodiment, the display apparatus may be a wearable display apparatus, which can be put on the human body in some ways, such as smart watch or smart bracelet.

The drawings in the present disclosure only involve the structures involved in the present disclosure. For other structures, a reference may be made to common designs. Without conflict, the features in the embodiments of the present disclosure may be combined with each other to obtain new embodiments.

Those skilled in the art should understand that modifications or equivalent replacements of the technical solution of the present disclosure may be made without departing from the essence and scope of the technical solution of the present disclosure, which, however, should be all included in the scope of the claims of the present disclosure.

What is claimed is:

1. A display substrate, comprising a base, a drive structure layer disposed on the base, a light emitting element disposed on the drive structure layer, an encapsulation layer disposed on the light emitting element, a circular polarizer layer disposed on the encapsulation layer, and a lens definition layer and a lens structure layer which are disposed on the circular polarizer layer, wherein
the light emitting element comprises a pixel definition layer provided with a plurality of sub-pixel openings;
the lens structure layer comprises a plurality of lenses disposed at intervals, the lens definition layer is disposed in a gap region between adjacent lenses, and an orthographic projection of each lens on the base contains an orthographic projection of at least one of the sub-pixel openings on the base,
wherein the lens definition layer comprises a plurality of first definition lines extending along a first direction and a plurality of second definition lines extending along a second direction, the plurality of first definition lines and the plurality of second definition lines intersect to define a plurality of grid regions, and the plurality of lenses are disposed in the plurality of grid regions in a one-to-one correspondence relationship.

2. The display substrate according to claim 1, wherein the pixel definition layer further comprises a plurality of retaining walls disposed around the sub-pixel openings, and an orthographic projection of the retaining walls on the base contains an orthographic projection of the lens definition layer on the base.

3. The display substrate according to claim 1, wherein a material of the lens definition layer is a hydrophobic material.

4. The display substrate according to claim 3, wherein the hydrophobic material comprises any one or more of Teflon, polyamide, polyolefin and siloxane.

5. The display substrate according to claim 1, wherein the drive structure layer comprises a thin film transistor, and the light emitting element further comprises an anode, an organic light emitting layer and a cathode, wherein
the anode is disposed on the drive structure layer and connected with a drain electrode of the thin film transistor; the pixel definition layer is disposed on the anode and the drive structure layer, and the sub-pixel opening exposes the anode; at least part of the organic light emitting layer is disposed in the sub-pixel opening, and the organic light emitting layer is connected with the anode; the cathode is disposed on the organic light emitting layer, and the cathode is connected with the organic light emitting layer.

6. A display apparatus, comprising the display substrate according to claim 1.

7. The display substrate according to claim 2, wherein the drive structure layer comprises a thin film transistor, and the light emitting element further comprises an anode, an organic light emitting layer and a cathode, wherein
the anode is disposed on the drive structure layer and connected with a drain electrode of the thin film transistor; the pixel definition layer is disposed on the anode and the drive structure layer, and the sub-pixel opening exposes the anode; at least part of the organic light emitting layer is disposed in the sub-pixel opening, and the organic light emitting layer is connected with the anode; the cathode is disposed on the organic light emitting layer, and the cathode is connected with the organic light emitting layer.

8. The display substrate according to claim 3, wherein the drive structure layer comprises a thin film transistor, and the light emitting element further comprises an anode, an organic light emitting layer and a cathode, wherein
the anode is disposed on the drive structure layer and connected with a drain electrode of the thin film transistor; the pixel definition layer is disposed on the anode and the drive structure layer, and the sub-pixel opening exposes the anode; at least part of the organic light emitting layer is disposed in the sub-pixel opening, and the organic light emitting layer is connected with the anode; the cathode is disposed on the organic light emitting layer, and the cathode is connected with the organic light emitting layer.

9. The display substrate according to claim 4, wherein the drive structure layer comprises a thin film transistor, and the light emitting element further comprises an anode, an organic light emitting layer and a cathode, wherein
the anode is disposed on the drive structure layer and connected with a drain electrode of the thin film transistor; the pixel definition layer is disposed on the anode and the drive structure layer, and the sub-pixel opening exposes the anode; at least part of the organic light emitting layer is disposed in the sub-pixel opening, and the organic light emitting layer is connected with the anode; the cathode is disposed on the organic light emitting layer, and the cathode is connected with the organic light emitting layer.

10. The display substrate according to claim 1, wherein the circular polarizer layer comprises an adhesive layer disposed on the encapsulation layer, a barrier layer disposed on the adhesive layer, a phase difference layer disposed on the barrier layer, and a polarizer layer disposed on the phase difference layer.

11. A method for manufacturing a display substrate, comprising:
sequentially forming a drive structure layer, a light emitting element, an encapsulation layer and a circular polarizer layer on a base, wherein the light emitting element comprises a pixel definition layer provided with a plurality of sub-pixel openings;
forming a lens definition layer and a lens structure layer on the circular polarizer layer, wherein the lens structure layer comprises a plurality of lenses disposed at intervals, the lens definition layer is disposed in a gap region between adjacent lenses, and an orthographic projection of each lens on the base contains an orthographic projection of at least one of the sub-pixel openings on the base,
wherein the lens definition layer comprises a plurality of first definition lines extending along a first direction and a plurality of second definition lines extending along a second direction, the plurality of first definition lines and the plurality of second definition lines intersect to define a plurality of grid regions, and the plurality of lenses are disposed in the plurality of grid regions in a one-to-one correspondence relationship.

12. The method for manufacturing a display substrate according to claim 11, wherein forming the lens definition layer on the circular polarizer layer comprises:
coating a layer of a hydrophobic material on the circular polarizer layer; and
patterning the hydrophobic material through a first patterning process to form the lens definition layer.

13. The method for manufacturing a display substrate according to claim 12, wherein forming the lens structure layer on the circular polarizer layer comprises:
coating a layer of an imprint lithography material with a uniform film thickness on the base on which the lens definition layer is formed;
patterning the imprint lithography material through a second patterning process to form a grid-like imprint lithography material, wherein the grid-like imprint lithography material does not overlap with the lens definition layer; and
performing imprint lithography on the grid-like imprint lithography material through an imprint lithography template to form a plurality of lenses disposed at intervals.

14. The method for manufacturing a display substrate according to claim 12, wherein the hydrophobic material comprises any one or more of Teflon, polyamide, polyolefin and siloxane.

15. The method for manufacturing a display substrate according to claim 12, wherein the pixel definition layer further comprises a plurality of retaining walls disposed around the sub-pixel openings, and an orthographic projection of the retaining walls on the base contains an orthographic projection of the lens definition layer on the base.

16. The method for manufacturing a display substrate according to claim 11, wherein the drive structure layer comprises a thin film transistor, and the light emitting element further comprises an anode, an organic light emitting layer and a cathode, wherein the anode is disposed on the drive structure layer and connected with a drain electrode of the thin film transistor; the pixel definition layer is disposed on the anode and the drive structure layer, and the sub-pixel opening exposes the anode; at least part of the organic light emitting layer is disposed in the sub-pixel opening, and the organic light emitting layer is connected with the anode; the cathode is disposed on the organic light emitting layer, and the cathode is connected with the organic light emitting layer.

17. The method for manufacturing a display substrate according to claim 13, wherein the hydrophobic material comprises any one or more of Teflon, polyamide, polyolefin and siloxane.

18. The method for manufacturing a display substrate according to claim 13, wherein the pixel definition layer further comprises a plurality of retaining walls disposed around the sub-pixel openings, and an orthographic projection of the retaining walls on the base contains an orthographic projection of the lens definition layer on the base.

19. The method for manufacturing a display substrate according to claim 11, wherein the circular polarizer layer comprises an adhesive layer disposed on the encapsulation layer, a barrier layer disposed on the adhesive layer, a phase difference layer disposed on the barrier layer, and a polarizer layer disposed on the phase difference layer.

\* \* \* \* \*